United States Patent
Antraygue et al.

(10) Patent No.: US 11,231,267 B2
(45) Date of Patent: Jan. 25, 2022

(54) MAGNETIC ANGULAR POSITION SENSOR

(71) Applicant: Ratier-Figeac SAS, Figeac (FR)

(72) Inventors: Cédric Antraygue, Figeac (FR); Nicolas Merdrignac, Lunan (FR)

(73) Assignee: RATIER-FIGEAC SAS, Figeac (FR)

( * ) Notice: Subject to any disclaimer, the term of this patent is extended or adjusted under 35 U.S.C. 154(b) by 175 days.

(21) Appl. No.: 16/665,175

(22) Filed: Oct. 28, 2019

(65) Prior Publication Data

US 2020/0149863 A1  May 14, 2020

(30) Foreign Application Priority Data

Nov. 13, 2018 (EP) ..................................... 18306483

(51) Int. Cl.
*G01B 7/30* (2006.01)
*G01R 33/07* (2006.01)
*G01R 33/09* (2006.01)
*B64G 1/14* (2006.01)

(52) U.S. Cl.
CPC ............. *G01B 7/30* (2013.01); *G01R 33/091* (2013.01); *B64G 1/14* (2013.01); *G01R 33/07* (2013.01)

(58) Field of Classification Search
CPC ......... G01B 7/30; G01R 33/091; G01R 33/07
See application file for complete search history.

(56) References Cited

U.S. PATENT DOCUMENTS

| 6,326,781 | B1* | 12/2001 | Kunde | .................. | G01D 5/145 324/144 |
|---|---|---|---|---|---|
| 8,970,211 | B1 | 3/2015 | Olsson et al. | | |
| 9,383,186 | B2 | 7/2016 | Trontelj | | |
| 9,574,867 | B2* | 2/2017 | Uberti | ...................... | G01B 7/30 |
| 10,971,981 | B2* | 4/2021 | Pichler | ................ | G01D 18/001 |
| 2015/0226581 | A1 | 8/2015 | Schott et al. | | |
| 2017/0315146 | A1* | 11/2017 | Koeck | .................. | G01C 25/005 |
| 2018/0087927 | A1* | 3/2018 | Anagawa | ................. | G01D 5/16 |

FOREIGN PATENT DOCUMENTS

| EP | 3385679 A1 | 10/2018 |
|---|---|---|
| WO | 2018087269 A1 | 5/2018 |

OTHER PUBLICATIONS

Extended European Search Report for International Application No. 18306483.1 dated Apr. 29, 2019, 7 pages.
EPO Official Letter for Application No. 18306483.1, dated Feb. 4, 2021, 5 pages.

* cited by examiner

*Primary Examiner* — Reena Aurora
(74) *Attorney, Agent, or Firm* — Cantor Colburn LLP

(57) ABSTRACT

A magnetic position sensor for determining the angular position of a magnet on a rotatable component, comprising: at least one magnetic sensor for determining different vector components of a magnetic field of the magnet; a memory having a look-up table stored therein that is populated with data representative of different angular positions of the magnet, the data representative of each angular position being correlated with data in the look-up table that is representative of the vector components that would be detected by the at least one magnetic sensor at that angular position; wherein the magnetic position sensor is configured to use the vector components determined by the magnetic sensor and logic to determine the angular position of the magnet from the look-up table.

13 Claims, 9 Drawing Sheets

MAGNETIC ANGULAR POSITION SENSOR

FOREIGN PRIORITY

This application claims priority to European Patent Application No. 18306483.1 filed Nov. 13, 2018, the entire contents of which is incorporated herein by reference.

FIELD

The present disclosure relates generally to magnetic position sensors having a magnet mounted on a rotatable component and configured to detect the rotational position of the rotatable component.

BACKGROUND

Magnetic position sensors are widely used for determining the rotational position of a component in a contactless manner. Typically, a magnet is provided on the rotatable component whose rotational (i.e. angular) position is required to be detected. The sensor typically comprises an integrated circuit having a microprocessor that is located in a fixed position relative to the rotatable component. The integrated circuit determines the amplitudes of two orthogonal components of the magnetic field emitted by the magnet and transmits them to the microprocessor. As the magnetic components are orthogonal to each other, these amplitudes vary in sinusoidal and cosinusoidal manners as the magnet is rotated, and can therefore be used, in combination, by the microprocessor to determine the rotational angle of the component at any given point in time. The microprocessor uses a computer algorithm, such as a CORDIC or (Arctan) algorithm, to determine the angular position from the sinusoidal and cosinusoidal signals.

However, it is time consuming and expensive to certify position sensors that comprise such microprocessors as being reliable due to the calculations that they must perform. This is particularly the case where the position sensors are used in safety critical applications, such as in the aerospace industry.

SUMMARY

The present disclosure provides a magnetic position sensor for determining the angular position of a magnet on a rotatable component, comprising: at least one magnetic sensor for determining different vector components of a magnetic field of the magnet; a memory (e.g. a non-volatile memory) having a look-up table stored therein that is populated with data representative of different angular positions of the magnet, the data representative of each angular position being correlated with data in the look-up table that is representative of the vector components that would be detected by the at least one magnetic sensor at that angular position; wherein the magnetic position sensor is configured to use the vector components determined by the magnetic sensor and logic to determine the angular position of the magnet from the look-up table.

The magnetic position sensor may output a signal representative or based on the angular position from the look-up table. This signal may be used to display the angular position or to control a device based on the angular position.

The at least one magnetic sensor may determine the amplitudes of the different vector components of the magnetic field, and the data in the look-up table may be representative of the amplitudes of the vector components that would be detected by the at least one magnetic sensor at the angular positions.

The at least one magnetic sensor may comprise magnetic sensors for determining two vector components of the magnetic field.

The at least one magnetic sensor may be configured to determine vector components of the magnetic field that are substantially orthogonal vector components.

One of the vector components may vary sinusoidally and the other may vary cosinusoidally as a function of the angular position of the magnet.

The magnetic position sensor may comprise said magnet.

The look-up table may be populated with multiple data pairs, each data pair comprising an angular position of the magnet and also the ratio of the different vector components of the magnetic field that would be detected by the at least one magnetic sensor at that angular position. The magnetic position sensor may further comprise a divider for determining the ratio of the different vector components of the magnetic field, and configured to use the ratio from the divider and said logic to look-up the corresponding angular position in the look-up table.

The divider may be an analog divider.

The look-up table may only include data for angular positions of the magnet in the range of greater than −90 degrees of rotation to less than +90 degrees of rotation.

The look-up table may be populated with a plurality of data pairs, each of which comprises a ratio of the different vector components of the magnetic field that would be detected with a failure of the magnetic position sensor, and data indicating that the magnetic position sensor has a failure. If these vector components are detected then the magnetic position sensor is able to determine it has a failure and may send an alert to a user, e.g. by controlling a display, light or speaker. The magnetic position sensor may comprise a logic device, such as a field programmable gate array or programmable logic device (PLD), that uses the ratio from the divider and said logic to look up the angular position in the look-up table. Alternatively, the magnetic position sensor, and therefore the logic device, may not comprise any programmable devices.

Optionally, a microprocessor is not used to calculate said ratio or to calculate the angular position from that ratio.

The look-up table may contain data pairs of the ratio values and the corresponding angular positions, for all angular positions over which the rotatable component may rotate; and the look-up table may comprise at least one such data pair for each degree of angular rotation over which the rotatable component is able to rotate. The look-up table may comprise such a data pair for each fraction of a degree of angular rotation over which the rotatable component is able to rotate.

The look-up table may be populated with multiple data triplets, each data triplet comprising an angular position of the magnet and the different vector components of the magnetic field that would be detected by the at least one magnetic sensor at that angular position. The magnetic position sensor may be configured to use the different vector components of the magnetic field determined by the at least one magnetic sensor and said logic to look-up the corresponding angular position in the look-up table.

The look-up table may comprise at least one such data triplet for each degree, or each fraction of a degree, of angular rotation over which the rotatable component may rotate.

The look-up table may include data for angular positions of the magnet over 360 degrees of rotation.

The multiple data triplets may include a plurality of data triplets that include the same angular position of the magnet but different combinations of the vector components of the magnetic field. It is recognised that at any given angular position of the magnet there may be some variability in the amplitudes of the sine and cosine signals, and this feature allows for such tolerances.

The look-up table may be populated with a plurality of data triplets, each of which comprises different vector components of the magnetic field that would be detected with a failure of the magnetic position sensor, and data indicating that the magnetic position sensor has a failure. If these vector components are detected then the magnetic position sensor is able to determine it has a failure and may send an alert to a user, e.g. by controlling a display, light or speaker.

The look-up table described herein may be stored in a dedicated memory, such as a non-volatile memory, that is external to any microcontrollers.

Optionally, the magnetic position sensor described herein does not contain any complex integrated circuits.

A microprocessor and/or an arithmetic logic unit (ALU) and/or multiplier and/or floating point unit may not be used to calculate the angular position of the magnet.

The magnetic position sensor described herein may not contain any integrated circuits other than the magnetic sensors, ADCs, logic device (e.g. the FPGA) and non-volatile memory. It is contemplated that the magnetic position sensor may comprise an application-specific integrated circuit (ASIC) having a logic device and no programmable devices. The memory on which the look-up table is stored, and optionally the ADCs and/or magnetic sensors, may be part of an ASIC.

The magnetic position sensor described herein may comprise a logic device, such as a field programmable gate array or programmable logic device (PLD), that uses the vector components determined by the at least one magnetic sensor and said logic to look up the angular position in the look-up table.

The look-up table may contain data representative of each angular position and its correlated data that is representative of the vector components that would be detected by the at least one magnetic sensor at that angular position. The look-up table may comprise such data for every degree, or every fraction of a degree, of angular rotation over a range of angular positions.

The range of angular positions may be a range of at least 45 degrees, at least 70 degrees, at least 90 degrees, at least 180 degrees, at least 270 degrees or 360 degrees.

The look-up table may comprises data for all angular positions over which the magnet may rotate.

The magnetic position sensor may further comprise a digital-to-analog converter or a pulse width modulator for receiving the angular position from the look-up table, wherein the digital-to-analog converter or a pulse width modulator is configured to generate a DC voltage that is directly proportional to the received angular position.

The present disclosure also provides a system comprising: a rotatable component and the magnetic position sensor described herein; wherein the magnet is mounted on the rotatable component. Optionally, the system may be an aerospace vehicle.

The rotatable component may be a rotatable shaft.

The present disclosure also provides a method of determining the angular position of a rotatable component, comprising: providing a magnet on a rotatable component; providing the magnetic position sensor described herein; determining different vector components of a magnetic field of the magnet on the rotatable component using the at least one magnetic sensor; and using the determined vector components and logic to determine the angular position of the magnet from the look-up table and hence to determine the angular position of the rotatable component.

The present disclosure also provides a method of calibrating a magnetic position sensor, comprising; providing a magnet on a rotatable component; providing the magnetic position sensor described herein; rotating the rotatable member through a range of angular positions whilst determining different vector components of a magnetic field of the magnet using the at least one magnetic sensor; recording, in the look-up table, data representative of different angular positions of the magnet within the range of angular positions; and recording in the look-up table, for each recorded angular position, correlated data that is representative of the vector components determined by the at least one magnetic sensor at that angular position.

An actuator may rotate the rotatable member through said range of angular positions.

An encoder may provide the angular position of rotation of the magnet for being recorded.

The look-up table may be a look-up table and two different vector components of the magnetic field may be determined whilst the rotatable member is rotated. The data that is stored in the look-up table may correspond to data that would result from the following steps: (a) for each recorded angular position, plotting the respective determined values of the vector components as points in a two-dimensional space, wherein the two dimensions of said space represent said two vector components; (b) defining a circular inner boundary around a zero-point in said space, wherein the zero-point represents where both of the vector components are zero, defining a circular outer boundary around the zero-point, wherein the inner and outer boundaries are positioned such that the plotted points are arranged between the inner and outer boundaries; (c) defining a radial line originating from the zero-point and passing through one of the plotted points; (d) determining that each of a plurality of locations located on the radial line and between the inner and outer boundaries indicate vector values in the two-dimensional space for the same angular position as for the angular position of said one of the plotted points; and (e) populating said look-up table with data that associates each of these different combinations of vector values with the angular position.

Steps (c) to (e) above may be performed for each of a plurality (e.g. all) of the plotted points.

The method may comprise determining that locations in the two-dimensional space that are not between the inner and outer boundaries indicate vector values which would be detected if the magnetic position sensor had failed. The method may populate the look-up table with these combinations of vector values and also correlated data indicating that the magnetic position sensor is in a failed state.

BRIEF DESCRIPTION OF THE DRAWINGS

Various embodiments will now be described, by way of example only, and with reference to the accompanying drawings in which.

DETAILED DESCRIPTION

Magnetic position sensors are widely used for determining the rotational (i.e. angular) position of a component in a contactless manner, such as in the automotive and aerospace industries.

Figure 1A:
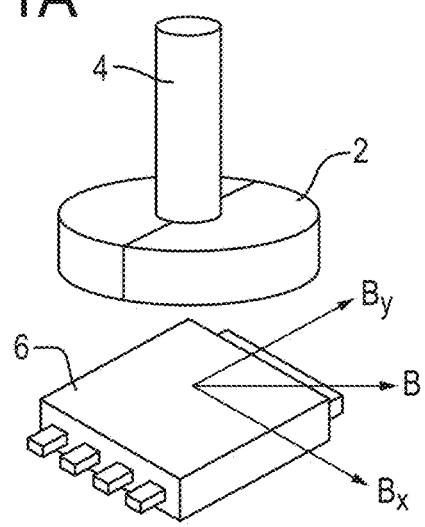
FIG. 1A shows a known magnetic position sensor and FIG. 1B shows the magnetic position sensor used in an aerospace application.
Figure 1B:
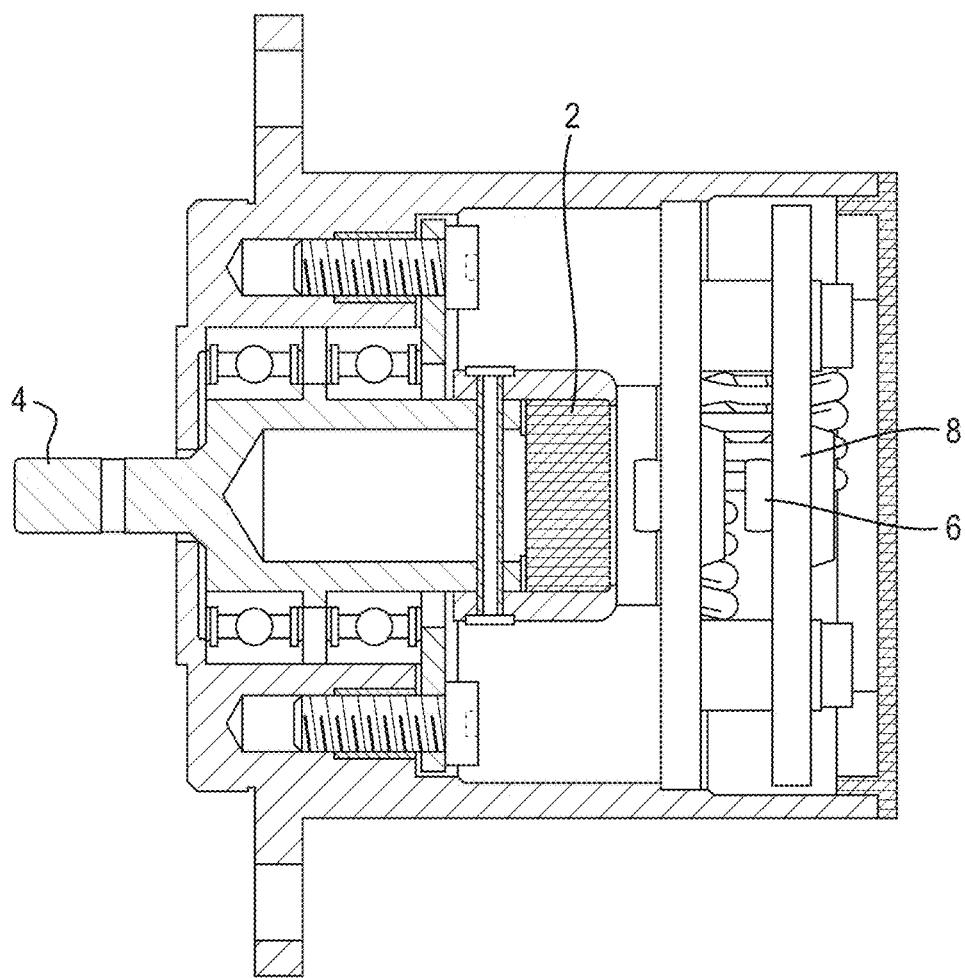

FIG. 1A shows an example of such a position sensor. A magnet 2 is provided on a rotatable component 4 whose rotational (i.e. angular) position is required to be detected. The sensor comprises an integrated circuit 6 having a processor that is located in a fixed position relative to the rotatable component 4. FIG. 1B shows a position sensor in an aerospace application where the magnet 2 is provided on a rotatable shaft 4 and the integrated circuit 6 is located on a component that is fixed relative to the shaft, such as on a printed circuit board 8.

As best shown in FIG. 1A, the integrated circuit 6 determines the amplitudes of two orthogonal vector components Bx,By of the magnetic field B emitted by the magnet 2 and transmits them to the processor. As the magnetic components Bx,By are orthogonal to each other, the amplitudes of the signals due to the magnetic components Bx,By vary sinusoidally and cosinusoidally as a function of the rotational angle of the magnet 2, as shown in FIG. 2.

Figure 2:
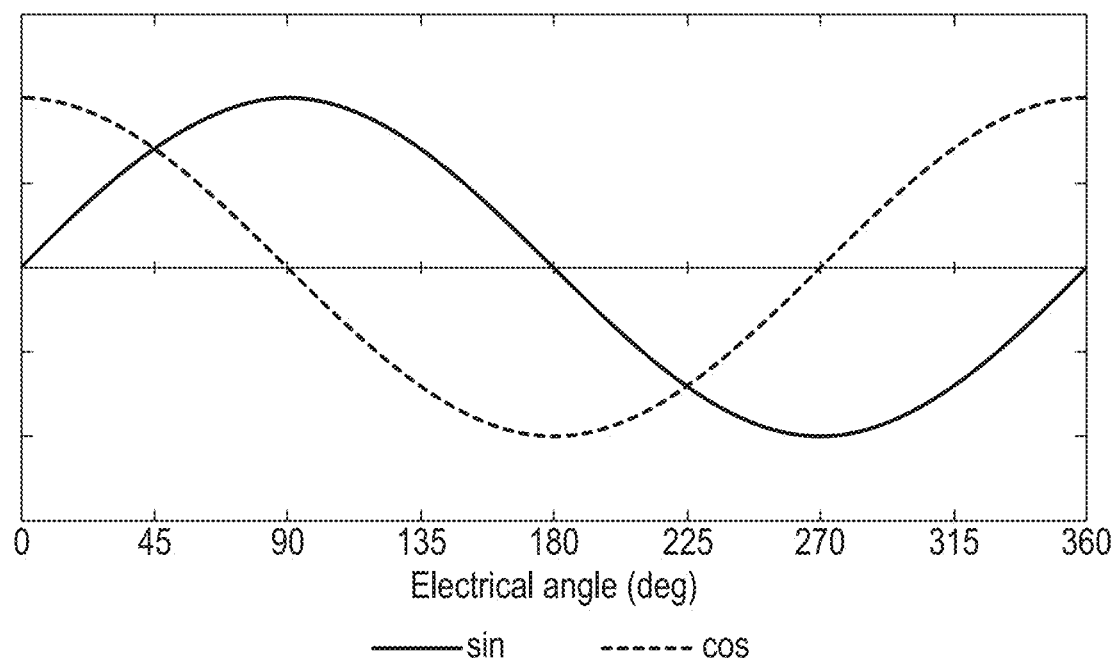
FIG. 2 shows how the orthogonal vector components of a magnetic field detected by the sensor of FIG. 1A vary with rotational angle of the magnet in the sensor.

As can be seen from FIG. 2, each rotational angle of the magnet 2 presents a unique combination of amplitudes for the sine and cosine signals. The combination of these signals can therefore be used to determine the rotational angle of the magnet 2 and hence of the rotatable component 4.

Figure 3:
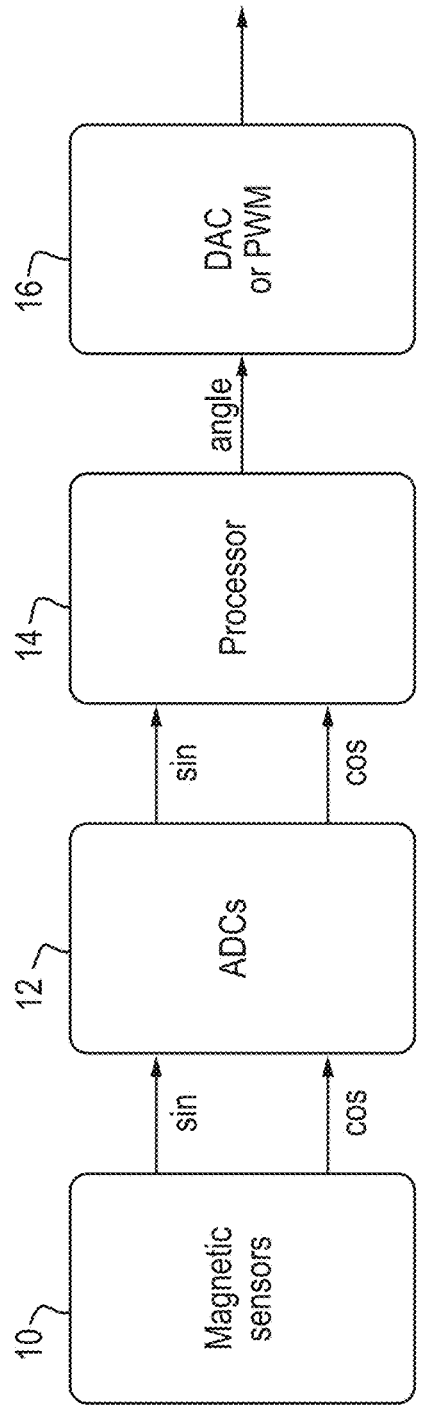
FIG. 3 shows a block diagram illustrating the main components of a conventional magnetic position sensor.

FIG. 3 shows a block diagram illustrating the main components of a conventional magnetic position sensor. The position sensor comprises magnetic sensors 10, such as Hall sensors, in the integrated circuit 6 for detecting the two orthogonal vector components Bx,By of the magnetic field from the magnet 2. As described above, these magnetic sensors 10 output signals that vary sinusoidally and cosinusoidally as a function of angular position of the magnet 2. The position sensor comprises analog-to-digital converters (ADCs) 12 for digitising the signals from the magnetic sensors 10. The digitised signal is then sent to a processor 14, which comprises an Arctan algorithm for determining the angular position of the magnet 2 from the digitised signals.

Figure 4:
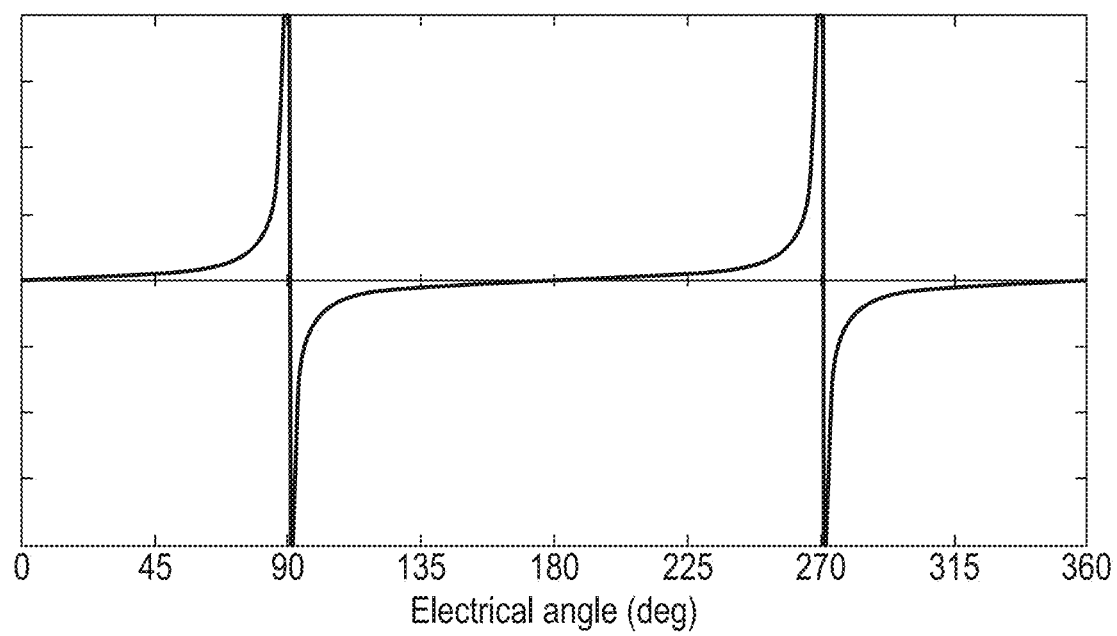
FIG. 4 shows how the ratio of the orthogonal vector components in FIG. 2 varies as a function of rotational angle of the magnet.

As described above, each rotational angle of the magnet 2 presents a unique combination of sine and cosine amplitudes and these signals can therefore be used to determine the rotational angle of the magnet 2 and hence of the rotatable component. This is performed by calculating the ratio of the sine signal to the cosine signal. FIG. 4 shows how such a ratio varies as a function of angular position θ of the magnet 2. The Arctan algorithm calculates this ratio (i.e. tan θ) and then determines the angular position θ as the arctan (i.e. inverse tangent) of this.

As shown in FIG. 3, the processor 14 generates a signal reflective of the calculated angular position and then transmits this to a digital-to-analog converter (DAC) or a pulse width modulator (PWM) 16.

However, it is time consuming and expensive to certify position sensors comprising such processors as being reliable due to the calculations that they must perform. This is particularly the case where the sensors are used in safety critical applications, such as in the aerospace industry.

According to embodiments of the present disclosure, there is provided a magnetic position sensor having a magnet 2 mounted on a rotatable component 4 whose rotational (i.e. angular) position is required to be detected. The position sensor also comprises magnetic sensors, such as Hall sensors, located in a fixed position relative to the rotatable component. For example, the magnet may be provided on a rotatable shaft so that the angular position of the shaft can be detected.

Figure 5:
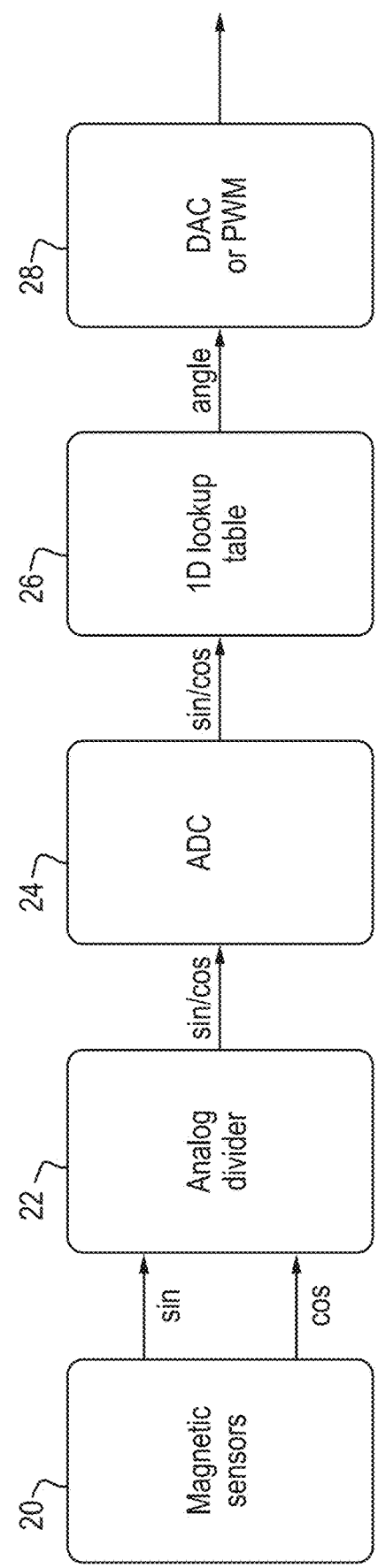
FIG. 5 shows a block diagram of the main components of a magnetic position sensor according to an embodiment of the present disclosure and having a 1D look-up table.

FIG. 5 shows a block diagram of the main components of a magnetic position sensor (other than the magnet 2) according to an embodiment of the present disclosure. The position sensor comprises magnetic sensors 20 for detecting two orthogonal vector components Bx,By of the magnetic field from the magnet 2. The magnetic sensors 20 may be Hall sensors or magneto-resistance sensors (such as AMR, GMR, CMR or TMR sensors). These magnetic sensors 20 output signals that vary sinusoidally and cosinusoidally as a function of angular position of the magnet 2. The position sensor comprises an analog divider 22 that divides the amplitude of the sinusoidally varying signal by the amplitude of the cosinusoidally varying signal (or vice versa) analogically so as to generate the tangent of the angular position (or arctangent), and which outputs a signal representative of that ratio to an analog-to-digital converter (ADC) 24. The ADC 24 digitises the signal and uses it to determine the angular position of the rotatable component from a one-dimensional (1D) look-up table 26, which will be discussed in more detail below.

Figure 6:
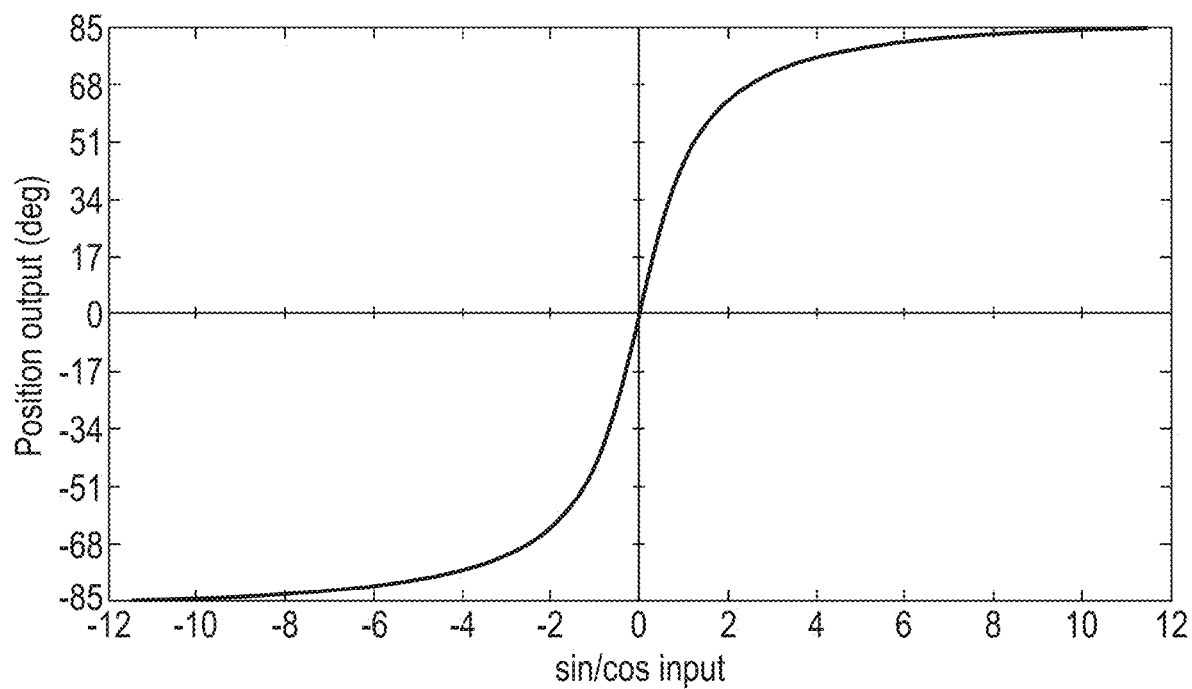
FIG. 6 is a graphical representation of the data stored in the 1D look-up table in the embodiment of FIG. 5.

As described above, and shown in FIG. 2, each rotational angle of the magnet 2 presents a unique combination of sine and cosine amplitudes and these signals can therefore be used in combination to determine the rotational angle of the magnet 2 (and hence of the rotatable component) from the ratio of the sinusoidal signal value to the cosinusoidal signal value (or inversely, from the cosine to sine ratio). The 1D look-up table 26 is populated with predetermined values of the sine/cosine ratio (or predetermined values of the cosine/sine ratio) that are linked to the respective angular positions of the magnet 2 at which these ratios occur. This is graphically represented by FIG. 6, which shows the angular position of the magnet as a function of the sine to cosine ratio. In this embodiment the look-up table 26 only includes data for angular positions of the magnet 2 between just above −90 degrees and just under +90 degrees. However, it is contemplated that other angular ranges may be provided, depending on the angular range over which the rotatable component 4 is permitted to rotate in use. It will be appreciated that the look-up table 26 includes multiple data pairs, wherein each pair comprises the sine to cosine ratio (or cosine to sine ratio) and the corresponding angular position of the magnet 2, rather than the image data in FIG. 6.

The position sensor uses computer logic to determine the angular position of the magnet 2, and hence of the rotatable component 4, from the sine to cosine ratio (or cosine to sine ratio). For example, the position sensor may comprise a logic device, such as a field programmable gate array (FPGA) or programmable logic device (PLD), that operates using the ratio and simple logic to look up the corresponding angular position from the look-up table 26. Referring to the embodiment in FIG. 5, the logic device may manage the ADC 24 to obtain the sine/cosine ratio (or cosine/sine ratio), and then obtain the corresponding angular position from the look-up table 26.

The look-up table 26 may be contained in an external memory (e.g. external to a microcontroller memory), such as a non-volatile memory.

According to the embodiments herein, a computer processor (or S/W) is not used to calculate the ratio of the sine and cosine values, or to calculate the angular position from that ratio (i.e. the arctan or tan value). In other words, once the sine to cosine ratio (or cosine to sine ratio) is determined in the embodiments, this is used to simply look up the angular position in the look-up table 26 without any further calculations being performed. As the position sensor does not perform any complex calculations, it is therefore reliable and useful in safety-critical technologies such as in aerospace vehicles.

In the embodiments of the present disclosure, the look-up table 26 contains data pairs of the ratio of the sine to cosine values and the corresponding angular positions, for all angular positions over which the rotatable component may rotate (or for all angular positions over which it is desired to detect rotation of the rotatable component). The look-up table 26 may comprise at least one such data pair for each degree (or each fraction of a degree) of angular rotation over which the rotatable component 4 may rotate.

The look-up table is therefore relatively large and may be seen as somewhat counter-intuitive, for example, as compared to storing only a limited number of such data points in a memory of a microprocessor within the position sensor, and using the microprocessor to interpolate other data points therebetween that are not stored in the look-up table. However, the inventors have recognised that it is undesirable to perform calculations in the position sensor because the sensor needs to be extremely reliable, and so a large look-up table should be provided that covers all of the angular positions of interest such that computer logic can be used to determine the angular positions. As such, embodiments of the present disclosure store the large look-up table in a (relatively large) memory that is external to any microcontrollers. The memory may be a dedicated memory for the look-up table. The embodiments do not use calculations to interpolate sine/cosine ratios or angular positions between those that are stored in the look-up table.

The magnetic position sensor may therefore not contain any complex integrated circuits.

Referring back to FIG. 5, the angular position obtained from the look-up table 26 is provided to the digital-to-analog converter (DAC) or a pulse width modulator (PWM) 28. The DAC or PWM 28 converts the signal to a signal representative of that which would have been generated by a potentiometer (e.g. a DC voltage that is directly proportional to angular position). This enables the magnetic position sensor (i.e. contactless sensor) of the embodiments to replace and emulate conventional analog potentiometer position sensors.

The look-up table 26 may be populated with data pairs by a calibration method. In other words, the rotatable member 4 may be rotated through the various angular positions that are recorded in the look-up table 26 and the sine/cosine ratios that occur at those values may be recorded in the look-up table 26 paired with their corresponding angular positions. This calibration method for populating the look-up table 26 compensates for any errors in the components of the position sensor, such as in the magnetic sensors 20 or analog divider 22. Thus the overall error in the angular position determined by the position sensor in normal use is minimised.

When calibrating the look-up table 26 in the position sensor, the user is able to select and set the zero angular-position for the position sensor. This zero angular-position and the corresponding sine/cosine ratio are then set in the look-up table 26. The positive and negative angular positions, relative to the zero angular-position, and their respective ratios, can also be stored in the look-up table 26.

Alternatively, the angular positions and their corresponding ratios may be stored in the look-up table 26 and a user may electronically adjust this stored data so as to set a selected angular position as the zero angular-position. The other angular positions are then adjusted so as to be set as positive and/or negative positions relative to this zero angular-position.

Figure 7:
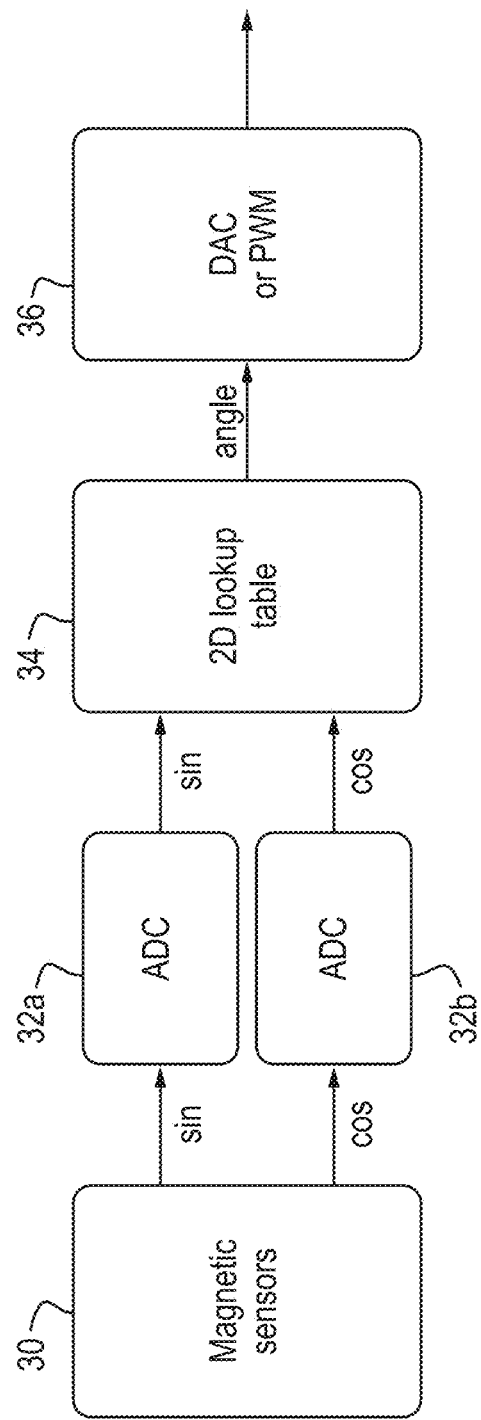
FIG. 7 shows a block diagram of the main components of a magnetic position sensor according to another embodiment of the present disclosure and having a 2D look-up table.

FIG. 7 shows a block diagram of the main components of a magnetic position sensor (other than the magnet 2) according to embodiments of the present disclosure that use a two dimensional (2D) look-up table. The position sensor comprises magnetic sensors 30 for detecting two orthogonal vector components Bx,By of the magnetic field from the magnet 2. The magnetic sensors 20 may be Hall sensors or magneto-resistance sensors (such as AMR, GMR, CMR or TMR sensors). These magnetic sensors 30 output signals that vary sinusoidally and cosinusoidally as a function of angular position of the magnet 2. The position sensor comprises an analog-to-digital converter (ADC) 32a, 32b for digitising each of the sinusoidally and cosinusoidally varying signals. The digitised signals are then used to determine the angular position of the rotatable component 4 from the 2D look-up table 34, which will be discussed in more detail below.

As described above, and shown in FIG. 2, each rotational angle of the magnet 2 presents a unique combination of sine and cosine amplitudes and these signals can therefore be used in combination to determine the rotational angle of the magnet 2 (and hence of the rotatable component 4).

Figure 8:
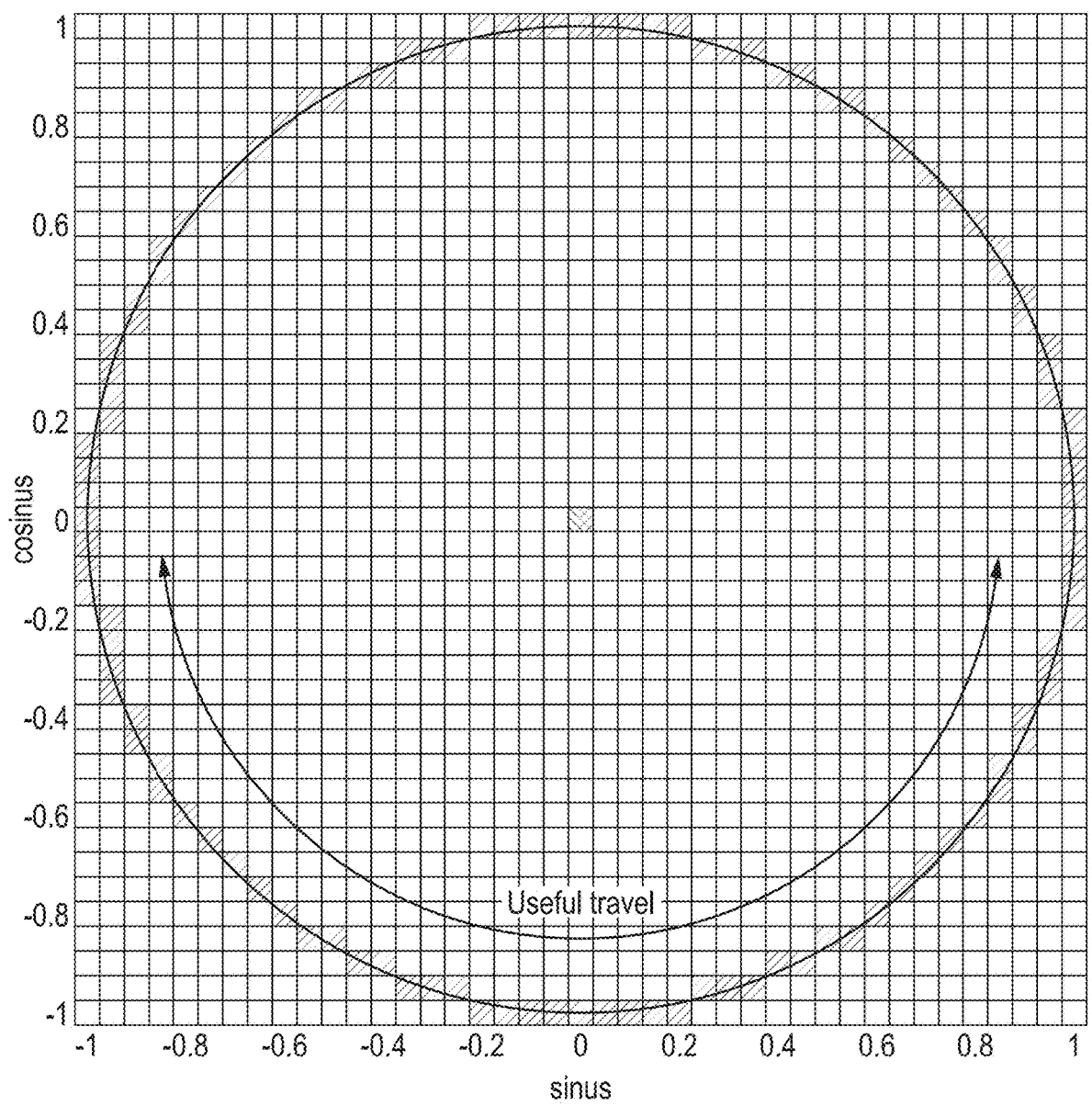
FIG. 8 is a graphical representation of the data stored in the 2D look-up table in the embodiment of FIG. 7.

The 2D look-up table 34 is populated with the different angular positions of the rotatable component 4. Each of the angular positions stored in the look-up table 34 is correlated with the amplitudes of both the sine and cosine signals that occur when the magnet 2 is at that angular position. This is graphically illustrated by FIG. 8, in which the x-axis represents the amplitude of the sine signal, the y-axis represents the amplitude of the cosine signal, and each of the darker boxes that are collectively arranged in a circle represents the data entry point in the look-up table 34 that contains the angular position, i.e. the arctan of the ratio of the sine to cosine value (or the tan of the ratio of the cosine to sine value). It will be appreciated that the look-up table 36 includes data points, rather than the image data in FIG. 8.

Referring back to FIG. 7, the position sensor uses the digitised sine and cosine signals from the ADCs 32a, 32b to determine the corresponding angular position of the magnet 2 from the 2D look-up table 34. As described for the previous embodiments, the position sensor uses computer logic to determine the angular position of the magnet 2, and hence of the rotatable component 4. For example, the position sensor may comprise a logic device, such as a field programmable gate array (FPGA) or programmable logic device (PLD), that operates using the sine and cosine values and simple logic to look up the corresponding angular position from the 2D look-up table 34. Referring to the embodiment in FIG. 7, the logic device may manage the ADCs 32 to obtain the sine and cosine values and then obtain the corresponding angular position from the 2D look-up table 34.

The look-up table may be contained in an external memory (e.g. external to a microcontroller memory), such as a non-volatile memory.

As described in relation to the earlier embodiments, a computer processor (or S/W) is not used to calculate the angular position from the sine and cosine values. In other words, once the sine to cosine values are determined, these are simply used to look up the angular position in the 2D look-up table 34 without any further calculations being performed. As the position sensor does not perform any complex calculations, it is therefore reliable and useful in safety-critical technologies such as in aerospace vehicles.

The look-up table 34 contains data triplets, wherein each triplet includes the sine value, the cosine value and the corresponding angular position, for all angular positions over which the rotatable component may rotate (or for all angular positions over which it is desired to detect rotation of the rotatable component). The 2D look-up table 34 may comprise at least one such data triplet for each degree of angular rotation over which the rotatable component 4 may rotate. The look-up table may comprise such a data triplet for each fraction of a degree of angular rotation over which the rotatable component is able to rotate.

The look-up table 34 may be stored in a (relatively large) memory that is external to any microcontrollers. The memory may be a dedicated memory for the look-up table 34. The embodiments do not use calculations to interpolate angular positions between those stored in the look-up table.

The magnetic position sensor may not contain any complex integrated circuits.

Referring back to FIG. 7, the angular position obtained from the look-up table 34 is provided to a digital-to-analog converter (DAC) or a pulse width modulator (PWM) 36. The DAC or PWM 36 converts the signal to a signal representative of that which would have been generated by a potentiometer (e.g. a DC voltage that is directly proportional to the angular position). This enables the magnetic position sensor (i.e. contactless sensor) of the embodiments to replace and emulate conventional analog potentiometer position sensors.

The look-up table 34 may be populated with data triplets by a calibration method, as described in relation to earlier embodiments herein. The rotatable member 4 may be rotated through the various angular positions that are recorded in the look-up table 34 and the sine and cosine values that occur at those angular values may be recorded in the look-up table 34 correlated with their corresponding angular positions. This calibration method for populating the look-up table 34 compensates for any errors in the components of the position sensor. Thus the overall error in the angular position determined by the position sensor in normal use is minimised.

When calibrating the look-up table 34 in the position sensor, the user is able to select and set the zero angular-position for the position sensor. This zero angular-position and the corresponding sine and cosine values are then set in the look-up table 34. The positive and negative angular positions, relative to the zero angular-position, and their respective sine and cosine values, can also be stored in the look-up table 34.

Alternatively, the angular positions and their corresponding sine and cosine values may be stored in the look-up table 34 and a user may electronically adjust this stored data so as to set a selected angular position as the zero angular-position. The other angular positions are then adjusted so as to be set as positive and/or negative positions relative to this zero angular-position.

The embodiment shown in FIG. 7 may be relatively small and less error prone, e.g. as an analog divider (and its associated temperature drift) is not present.

As the 2D look-up table 34 uses separate sine and cosine values, it is able to be used over a large range of angular positions to be detected, e.g. as opposed to the discontinuous tan function shown in FIG. 4. The position sensor using the 2D look-up table 34 may monitor the angular position of a rotatable component over 360 degrees of rotation.

Figure 9:
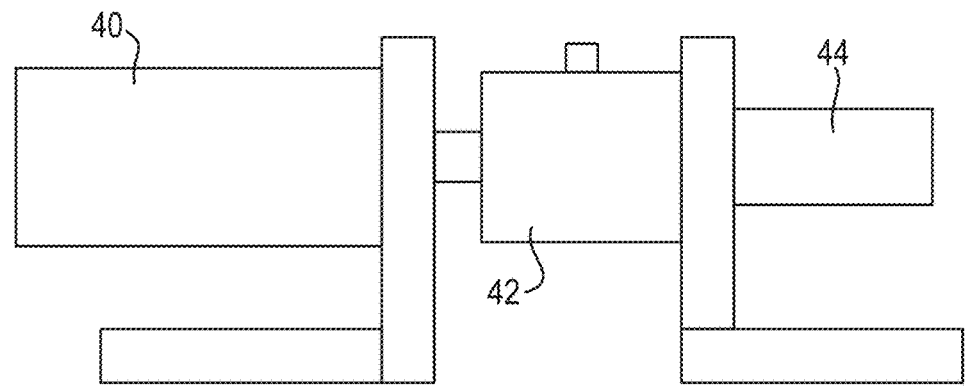
FIG. 9 shows a schematic of an apparatus for use in populating the 1D or 2D look-up tables 26, 34.

FIG. 9 shows a schematic of an apparatus for use in the aforementioned calibration methods for populating either the 1D or 2D look-up table 26,34. The apparatus comprises an actuator 40 for rotating a magnet 2, an encoder 42 for providing the angular position of rotation of the magnet 2 caused by the actuator 40, and the magnetic position sensor 44 having the look-up table 26,34 to be populated. The magnet 2 may be the same magnet, or substantially the same as the magnet that is provided in the final magnetic position sensor 44.

The method comprises using the actuator 40 to rotate the magnet 2 over the range of angles that the magnetic position sensor 44 is desired to detect in use, e.g. over 360 degrees. During the rotation, the outputs from the magnetic sensors 20,30 (i.e. the sine and cosine signals) are determined along with their corresponding rotational angle from the encoder 42. For the 2D look-up table 34, each angular position from the encoder 42 is recorded in the look-up table 34 along with the corresponding sine and cosine values from the magnetic sensors 30, such that the angle is correlated with the sine and cosine values. For the 1D look-up table 26, each angular position from the encoder 42 is recorded in the look-up table 26 along with a ratio of the corresponding sine and cosine values from the magnetic sensors 20, such that the angle is correlated with the ratio.

Figure 10:
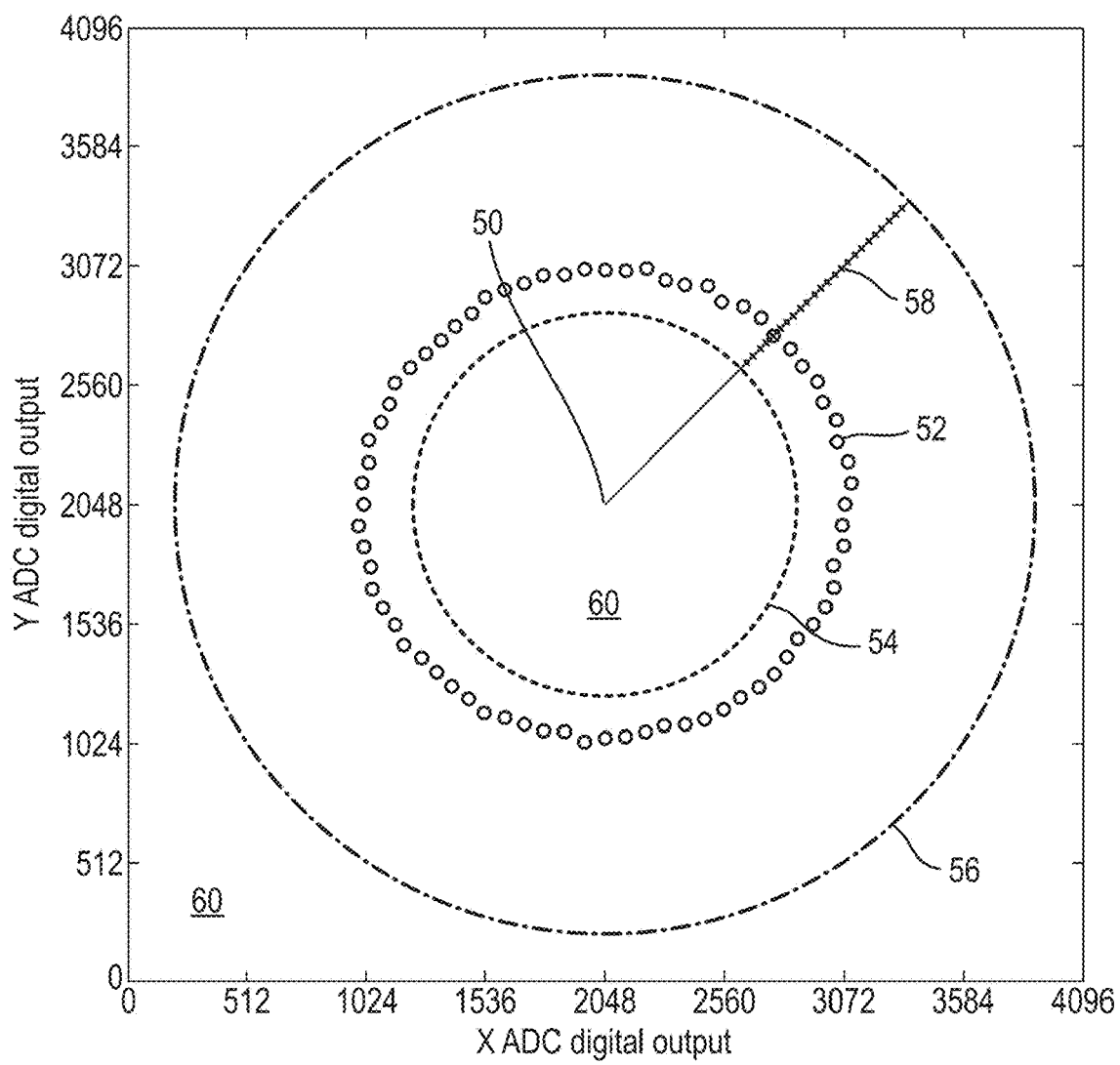
FIG. 10 graphically represents how data for the 2D look-up table may be generated.

It is recognised that at any given angular position of the magnet 2 there may be some variability in the amplitudes of the sine and cosine signals. Accordingly, for the 2D look-up table 34, multiple different combinations of sine and cosine amplitudes may be recorded in the look-up table for any given angular position. FIG. 10 shows an example of this.

FIG. 10 graphically represents how data may be stored in the 2D look-up table. The x-axis represents the amplitude of the detected sine signal and the y-axis represents the amplitude of the detected cosine signal in the same manner as FIG. 8, except that in the embodiment shown in FIG. 10 the vales on the axes represent the digital outputs from the ADCs 32a, 32b of FIG. 7. The central position 50 in FIG. 10 represents where both the sine and cosine values are zero (hereinafter referred to as the "zero-point"). As described in relation to FIG. 9, the outputs from the magnetic sensors 30 are determined as the magnet 2 is rotated. In FIG. 10, each of the plurality of small circular shaped points 52 that are arranged in a circle surrounding the zero-point 50 represents the sine and cosine outputs from the magnetic sensors 30 at a particular rotational angle of the magnet 2. The outputs from the magnetic sensors 30 are recorded periodically as the magnet 2 is rotated, which is why a plurality of the points are arranged in a circle.

However, if only these magnetic sensor output values were stored in the look-up table 34, along with their respective angular positions, then the magnetic position sensor 44 would need to be operated under very similar conditions to those in which it was calibrated. In order to avoid this, and to account for tolerances in the amplitudes of the magnetic sensor output values at any given angular position, multiple different combinations of sine and cosine amplitudes may be recorded in the look-up table 34 for any given angular position of the magnet 2. This may be achieved as follows.

When the data is considered to be represented as shown in FIG. 10, a circular inner boundary 54 may be considered to be provided around the zero-point 50 (that represents where both the sine and cosine values are zero) and a circular outer boundary 56 may be considered to be provided around the zero-point 50, wherein the boundaries 54,56 are positioned such that the plurality of points 52 representing the outputs from the magnetic sensors during calibration are arranged between the inner and outer boundaries. All combinations of sine and cosine values which fall along any given radial line 58 (originating from the zero-point 50), at locations between the inner and outer boundaries 54,56, may be considered to represent the same angular position of the magnet 2. Such a radial line 58 may be considered to pass through each of the points 52 measured in the calibration step. Therefore, for any given point 52 measured in the calibration step, a plurality of different combinations of sine and cosine values which fall along the radial line 58 passing through said point 52 (at locations between the inner and outer boundaries 54,56) are considered to represent the same angular position of the magnet 2 as the angular position for said point 52 measured in the calibration step. The look-up table 34 is then populated with data that associates each of these different combinations of sine and cosine values with the angular position. This may be repeated for each, or at least some, of the points 52 measured in the calibration step.

When the data is considered to be represented as shown in FIG. 10, the combinations of sine and cosine values that do not fall between the inner and outer boundaries 54,56 may be considered to be abnormal and represent a failure state of the magnetic position sensor 44. Accordingly, each of these combinations of sine and cosine values may be stored in the look-up table 34 associated with data indicating that there has been a failure of the magnetic position sensor 44. This failure data is represented by reference numerals 60. If one of these combinations of sine and cosine values is output by the magnetic sensors 30 then the magnetic position sensor 44 may detect from the look-up table 34 that it has a failure. In response to this it may output a signal that controls a display or other output means to indicate that the position sensor 44 has failed.

Figure 11A:
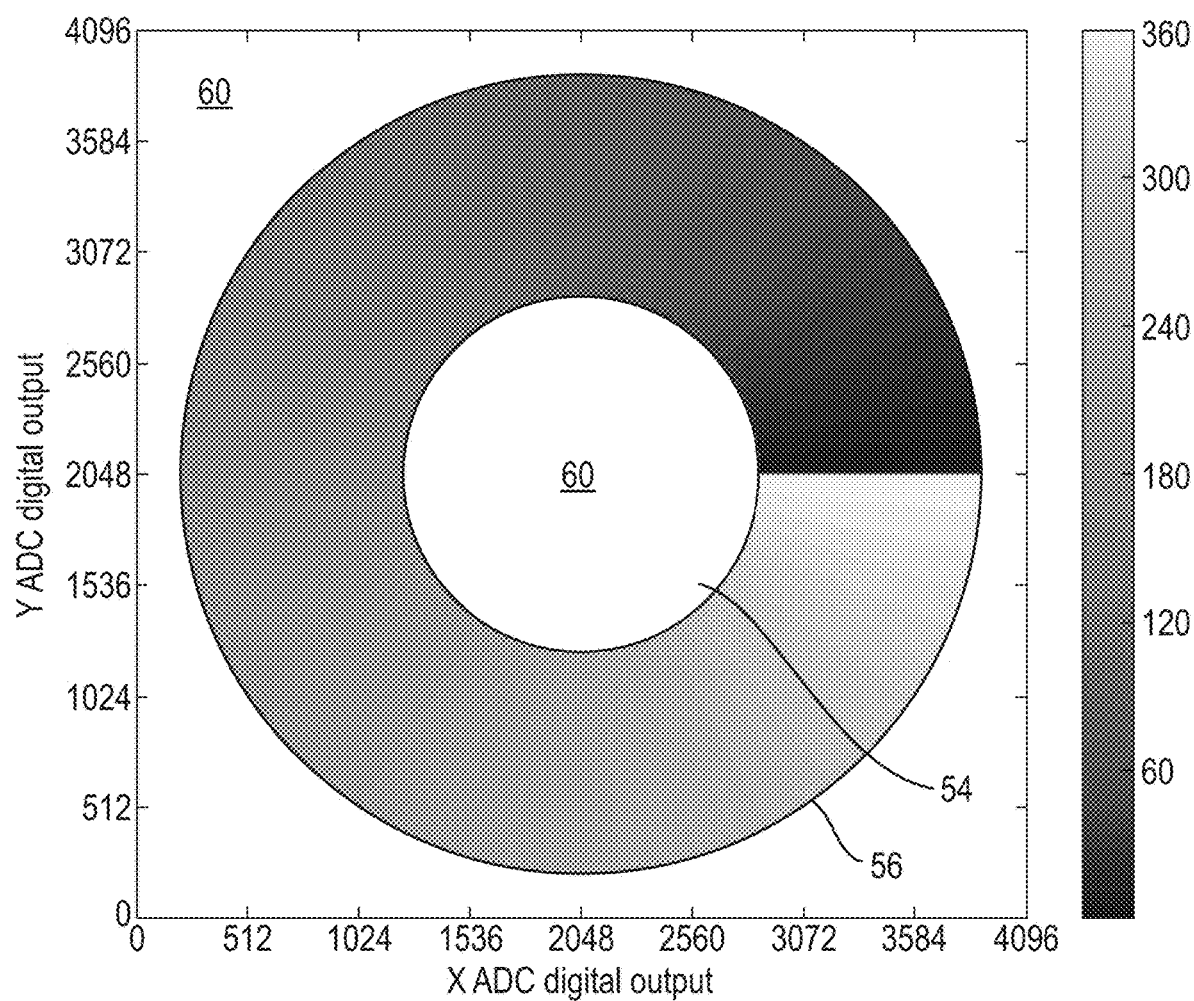
FIGS. 11A and 11B show different representations of the data in the 2D look-up table.
Figure 11B:
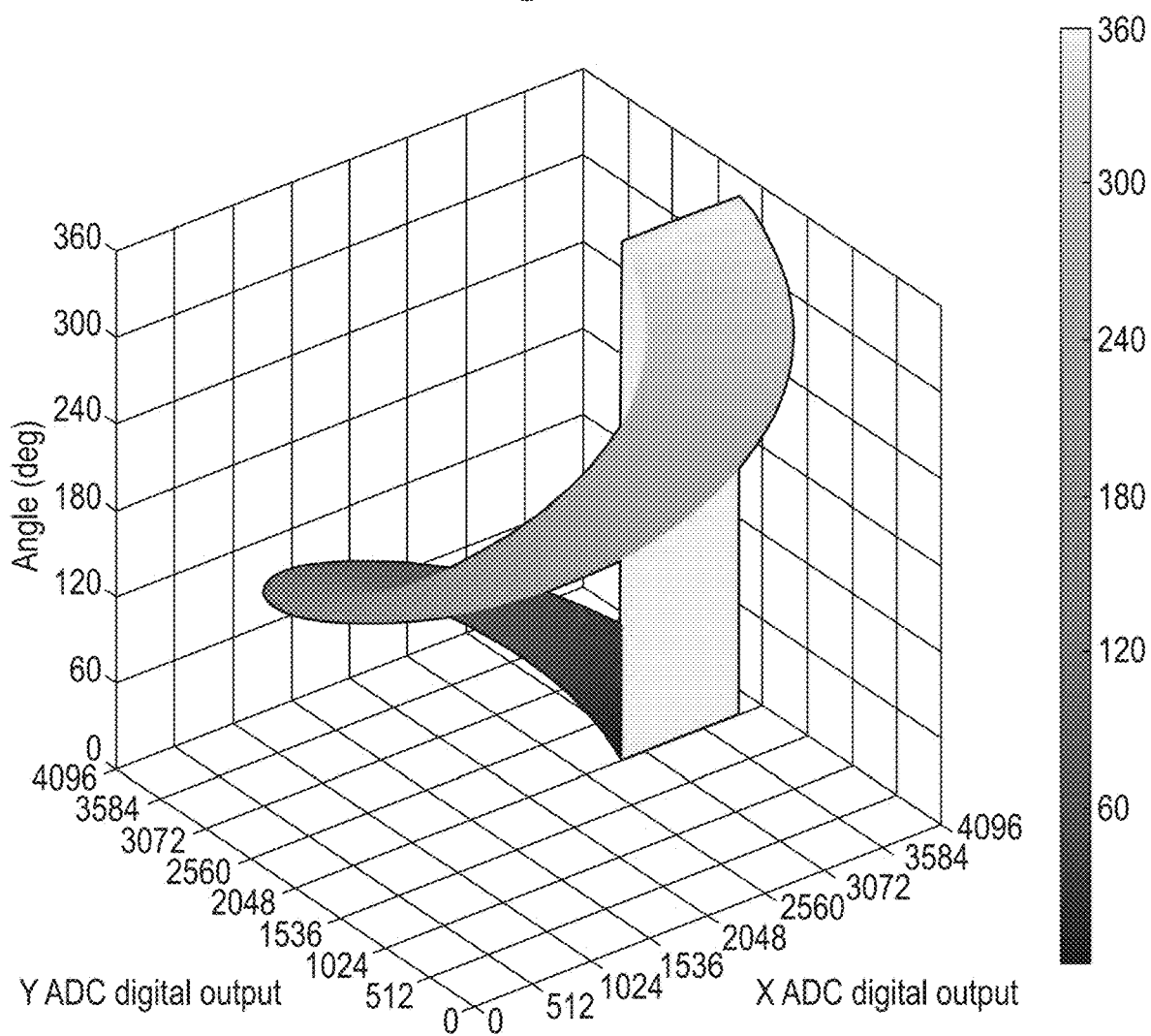

FIG. 11A represents the data in the look-up table described above with respect to FIG. 10, wherein the different angular positions stored in the look-up table 34 are represented by the variations in shading between the boundaries 54,56. FIG. 11B shows the same representation of the look-up table as in FIG. 11A, except that the angular positions stored in the look-up table 34 are also represented by being plotted in a third dimension. In these examples, the resolution of the ADCs is 12 bits, although it will be appreciated that other values may be used.

Figure 12:
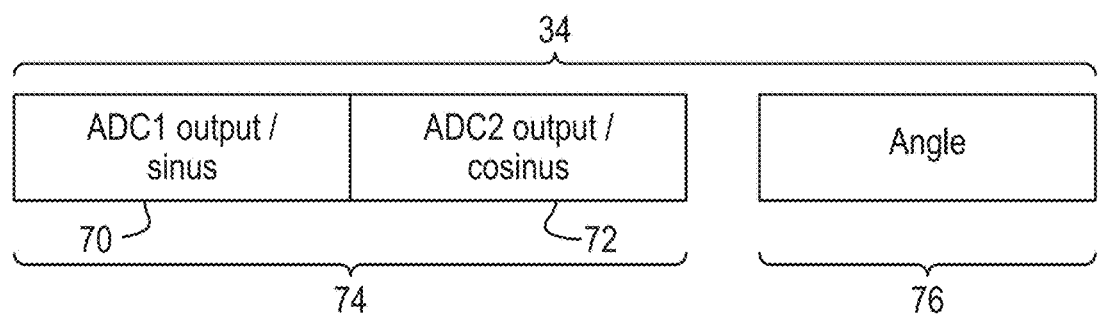
FIG. 12 shows how data may be assigned to the look-up table memory.

FIG. 12 shows an implementation of the 2D look-up table 34. The "ADC1 output" 70 from ADC 32a and the "ADC2 output" 72 from ADC 32b (see FIG. 7) are read simultaneously to obtain the sine and cosine signals from the magnetic sensors 30. These ADCs outputs 70,72 may be merged to form a memory address, in an address bus 74. Data representing the corresponding rotational angular position, in a data bus 76, is associated with the memory address. The look-up table 34 may be parallel flash memory.

The magnetic position sensor described herein may not contain any integrated circuits other than the ADCs, logic device and non-volatile memory. It is contemplated that the magnetic position sensor may comprise an application-specific integrated circuit (ASIC) having the logic device and no programmable devices. The memory on which the look-up table is stored, and optionally the ADCs and/or magnetic sensors, may be part of ASIC.

Although the present disclosure has been described with reference to various embodiments, it will be understood by those skilled in the art that various changes in form and detail may be made without departing from the scope of the invention as set forth in the accompanying claims.

The invention claimed is:

1. A magnetic position sensor for determining the angular position of a magnet on a rotatable component, comprising:
   at least one magnetic sensor for determining different vector components of a magnetic field of the magnet; and
   a memory having a look-up table stored therein that is populated with data representative of different angular positions of the magnet, the data representative of each angular position being correlated with data in the look-up table that is representative of the vector components that would be detected at that angular position by the at least one magnetic sensor;
   wherein the magnetic position sensor is configured to use the vector components determined by the magnetic sensor and logic to determine the angular position of the magnet from the look-up table;
   wherein the look-up table is populated with multiple data pairs, each data pair comprising an angular position of the magnet and also the ratio of the different vector components of the magnetic field that would be detected at that angular position by the at least one magnetic sensor; and
   wherein the magnetic position sensor further comprises a divider for determining the ratio of the different vector components of the magnetic field, and is configured to use the ratio from the divider and said logic to look-up the corresponding angular position in the look-up table.

2. The magnetic position sensor of claim 1, wherein the at least one magnetic sensor is configured to determine vector components of the magnetic field that are substantially orthogonal vector components.

3. The magnetic position sensor of claim 1,
   wherein the look-up table is stored in a dedicated memory that is external to any microcontrollers; and/or
   wherein a microprocessor is not used to calculate the angular position of the magnet; and/or
   wherein the magnetic position sensor does not contain any integrated circuits other than an ADC, logic device, magnetic sensor or non-volatile memory.

4. The magnetic position sensor of claim 1, comprising a logic device, a field programmable gate array or a programmable logic device that uses the vector components determined by the at least one magnetic sensor and said logic to look up the angular position in the look-up table.

5. The magnetic position sensor of claim 1, wherein the look-up table contains data representative of each angular position and its correlated data that is representative of the vector components that would be detected by the at least one magnetic sensor at that angular position, and wherein the look-up table comprises such data for every degree, or every fraction of a degree, of angular rotation over a range of angular positions.

6. The magnetic position sensor of claim 1, further comprising a digital-to-analog converter or a pulse width modulator for receiving the angular position from the look-up table, wherein the digital-to-analog converter or a pulse width modulator is configured to generate a DC voltage that is directly proportional to the received angular position.

7. A system comprising: a rotatable component and the magnetic position sensor of claim 1; wherein the magnet is mounted on the rotatable component.

8. The system of claim 7, wherein the system is an aerospace vehicle.

9. A magnetic position sensor for determining the angular position of a magnet on a rotatable component, comprising:
- at least one magnetic sensor for determining different vector components of a magnetic field of the magnet; and
- a memory having a look-up table stored therein that is populated with data representative of different angular positions of the magnet, the data representative of each angular position being correlated with data in the look-up table that is representative of the vector components that would be detected at that angular position by the at least one magnetic sensor;
wherein the magnetic position sensor is configured to use the vector components determined by the magnetic sensor and logic to determine the angular position of the magnet from the look-up table;
wherein the look-up table is populated with a plurality of data pairs, each of which comprises a ratio of the different vector components of the magnetic field that would be detected with a failure of the magnetic position sensor, and data indicating that the magnetic position sensor has a failure.

10. A magnetic position sensor for determining the angular position of a magnet on a rotatable component, comprising:
- at least one magnetic sensor for determining different vector components of a magnetic field of the magnet; and
- a memory having a look-up table stored therein that is populated with data representative of different angular positions of the magnet, the data representative of each angular position being correlated with data in the look-up table that is representative of the vector components that would be detected at that angular position by the at least one magnetic sensor;
wherein the magnetic position sensor is configured to use the vector components determined by the magnetic sensor and logic to determine the angular position of the magnet from the look-up table;
wherein the look-up table is populated with multiple data triplets, each data triplet comprising an angular position of the magnet and the different vector components of the magnetic field that would be detected at that angular position by the at least one magnetic sensor; and
wherein the magnetic position sensor is configured to use the different vector components of the magnetic field determined by the at least one magnetic sensor and said logic to look-up the corresponding angular position in the look-up table.

11. The magnetic position sensor of claim 10, wherein the look-up table comprises at least one such data triplet for each degree, or each fraction of a degree, of angular rotation over which the rotatable component may rotate.

12. The magnetic position sensor of claim 11, wherein the multiple data triplets include a plurality of data triplets that include the same angular position of the magnet but different combinations of the vector components of the magnetic field.

13. The magnetic position sensor of claim 12, wherein the look-up table is populated with a plurality of data triplets, each of which comprises different vector components of the magnetic field that would be detected with a failure of the magnetic position sensor, and data indicating that the magnetic position sensor has a failure.

\* \* \* \* \*